(12) United States Patent
Kim

(10) Patent No.: US 10,162,703 B2
(45) Date of Patent: Dec. 25, 2018

(54) METHODS OF CORRECTING DATA ERRORS AND SEMICONDUCTOR DEVICES USED THEREIN

(71) Applicant: SK hynix Inc., Icheon-si (KR)

(72) Inventor: Chang Hyun Kim, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 96 days.

(21) Appl. No.: 15/373,045

(22) Filed: Dec. 8, 2016

(65) Prior Publication Data

US 2017/0371746 A1 Dec. 28, 2017

(30) Foreign Application Priority Data

Jun. 23, 2016 (KR) ........................ 10-2016-0078817

(51) Int. Cl.
| | |
|---|---|
| *G11C 29/00* | (2006.01) |
| *G06F 11/10* | (2006.01) |
| *G06F 3/06* | (2006.01) |
| *G11C 29/52* | (2006.01) |
| *H03M 13/15* | (2006.01) |
| *H03M 13/00* | (2006.01) |
| *H03M 13/29* | (2006.01) |
| *H03M 13/19* | (2006.01) |

(52) U.S. Cl.
CPC .......... *G06F 11/1068* (2013.01); *G06F 3/064* (2013.01); *G06F 3/0619* (2013.01); *G06F 3/0679* (2013.01); *G11C 29/52* (2013.01); *H03M 13/1575* (2013.01); *H03M 13/2909* (2013.01); *H03M 13/616* (2013.01); *H03M 13/19* (2013.01)

(58) Field of Classification Search
CPC .... G06F 11/1068; G06F 3/064; G06F 3/0619; G06F 3/0679; H03M 13/616; H03M 13/1575; G11C 29/52
See application file for complete search history.

(56) References Cited

U.S. PATENT DOCUMENTS

| | | | | |
|---|---|---|---|---|
| 5,146,461 | A * | 9/1992 | Duschatko | .......... G06F 11/1044 714/772 |
| 2007/0079226 | A1* | 4/2007 | Hoya | .................. G06F 11/1032 714/801 |
| 2009/0319863 | A1* | 12/2009 | Shirai | ................. G06F 11/1068 714/755 |
| 2013/0139028 | A1 | 5/2013 | Goel | |
| 2014/0173386 | A1 | 6/2014 | Kern et al. | |
| 2015/0121164 | A1* | 4/2015 | Kamali | .................. G06F 11/10 714/758 |

* cited by examiner

*Primary Examiner* — Thien Nguyen
(74) *Attorney, Agent, or Firm* — William Park & Associates Ltd.

(57) ABSTRACT

A semiconductor device correcting data errors using a hamming code is provided. The hamming code is realized by an error check matrix, and the error check matrix includes a first sub-matrix and a second sub-matrix. The first sub-matrix includes column vectors having an odd weight. The second sub-matrix includes an up matrix and a down matrix. Each of the up matrix and the down matrix includes column vectors having an odd weight.

20 Claims, 14 Drawing Sheets

FIG.3

| NUMBER OF PARITY BITS | FIRST SUB-MATRIX | SECOND SUB-MATRIX | | |
|---|---|---|---|---|
| | | UP MATRIX | DOWN MATRIX | TOTAL |
| 4 | 4C3=4 | 2C1=2 | 2C1=2 | 2×2=4 |
| 5 | 5C3+5C5=11 | 3C1+3C3=4 | 2C1=2 | 4×2=8 |
| 7 | 7C3+7C5+7C7=57 | 5C1+5C3+5C5=16 | 2C1=2 | 16×2=32 |
| | | 4C1+4C3=8 | 3C1+3C3=4 | 8×4=32 |
| 8 | 8C3+8C5+8C7=120 | 5C1+5C3+5C5=16 | 3C1+3C3=4 | 16×4=64 |
| | | 4C1+4C3=8 | 4C1+4C3=8 | 8×8=64 |

FIG.4

| | 1a | | | | | | | | |
|---|---|---|---|---|---|---|---|---|---|
| R1 | 1 | 0 | 1 | 1 | 1 | 0 | 1 | 0 | ⎫ 21a |
| R2 | 1 | 1 | 0 | 1 | 0 | 1 | 0 | 1 | ⎬ 2a |
| R3 | 1 | 1 | 1 | 0 | 1 | 1 | 0 | 0 | ⎭ 22a |
| R4 | 0 | 1 | 1 | 1 | 0 | 0 | 1 | 1 | |
| | C1 | C2 | C3 | C4 | C5 | C6 | C7 | C8 | |

FIG.10

|    | 5a       |     |     |     | 6a  |     |     |     |
|    | 51a | 52a | 53a | 54a | 61a | 62a | 63a | 64a |
| --- | --- | --- | --- | --- | --- | --- | --- | --- |
| R1 | 1 | 0 | 1 | 0 | 1 | 1 | 1 | 0 |
| R2 | 0 | 1 | 1 | 0 | 1 | 1 | 0 | 1 |
| R3 | 1 | 1 | 1 | 0 | 0 | 1 | 1 | 0 |
| R4 | 1 | 1 | 0 | 1 | 1 | 0 | 0 | 1 |
|    | C1 | C2 | C3 | C4 | C5 | C6 | C7 | C8 |

FIG.12

|    | 7a  |     |     |     | 8a  |     |     |     |
|    | 71a | 72a | 73a | 74a | 81a | 82a | 83a | 84a |

|    |    |    |    |    |    |    |    |    |
|----|----|----|----|----|----|----|----|----|
| R1 | 1  | 1  | 1  | 0  | 0  | 1  | 1  | 0  |
| R2 | 1  | 1  | 0  | 1  | 1  | 0  | 0  | 1  |
| R3 | 1  | 0  | 0  | 1  | 0  | 0  | 1  | 1  |
| R4 | 0  | 1  | 1  | 0  | 1  | 1  | 1  | 1  |
|    | C1 | C2 | C3 | C4 | C5 | C6 | C7 | C8 |

# METHODS OF CORRECTING DATA ERRORS AND SEMICONDUCTOR DEVICES USED THEREIN

CROSS-REFERENCE TO RELATED APPLICATIONS

The present application claims priority under 35 U.S.C 119(a) to Korean Patent Application No. 10-2016-0078817, filed on Jun. 23, 2016, which is incorporated herein by reference in its entirety.

BACKGROUND

1. Technical Field

Embodiments of the present disclosure relate to methods of correcting data errors and semiconductor devices used therein.

2. Related Art

Recently, a DDR2 scheme or a DDR3 scheme for receiving and outputting four bit data or eight bit data during each clock cycle time has been used to improve an operation speed of semiconductor devices. If data transmission speed of a semiconductor device becomes faster, the probability of errors occurring may increase while the semiconductor device operates. Accordingly, novel design schemes have been proposed to improve the reliability of data transmission.

Whenever data is transmitted in semiconductor devices, error codes which are capable of detecting an occurrence of errors may be generated and transmitted with the data to improve reliability of data transmission. The error codes may include an error detection code (EDC) which is capable of detecting errors and an error correction code (ECC) which is capable of correcting the errors by itself.

SUMMARY

According to an embodiment, a semiconductor device includes a parity generation circuit configured to generate a parity signal from an input data signal using a hamming code, a data storage circuit configured to store the input data signal and the parity signal during a write operation and configured to generate an output data signal and an output parity signal during a read operation, and a syndrome generation circuit configured to generate a syndrome signal for correcting errors of the output data signal from the output data signal and the output parity signal using the hamming code. The hamming code is realized by an error check matrix. The error check matrix includes a first sub-matrix and a second sub-matrix. The first sub-matrix includes column vectors having an odd weight. The second sub-matrix includes an up matrix and a down matrix. Each of the up matrix and the down matrix includes column vectors having an odd weight.

According to another embodiment, a semiconductor device includes a parity generation circuit configured to generate a parity signal from an input data signal using a hamming code, a data storage circuit configured to store the input data signal and the parity signal during a write operation and configured to generate an output data signal and an output parity signal during a read operation, and a syndrome generation circuit configured to generate a syndrome signal for correcting errors of the output data signal from the output data signal and the output parity signal using the hamming code. The hamming code is realized by an error check matrix. The error check matrix includes a first sub-matrix and a second sub-matrix. The first sub-matrix includes column vectors having an odd weight. The second sub-matrix includes a first up matrix, a first down matrix, a second up matrix and a second down matrix. The first down matrix includes column vectors having an even weight. Each of the first up matrix, the second up matrix and the second down matrix includes column vectors having an odd weight.

According to another embodiment, a semiconductor device includes a parity generation circuit configured to generate a parity signal from an input data signal using a hamming code, a data storage circuit configured to store the input data signal and the parity signal during a write operation and configured to generate an output data signal and an output parity signal during a read operation, and a syndrome generation circuit configured to generate a syndrome signal for correcting errors of the output data signal from the output data signal and the output parity signal using the hamming code. The hamming code is realized by an error check matrix. The error check matrix includes a first sub-matrix and a second sub-matrix. The first sub-matrix includes column vectors having an odd weight. The second sub-matrix includes a first up matrix, a first down matrix, a second up matrix and a second down matrix. The first up matrix includes column vectors having an even weight. Each of the first down matrix, the second up matrix and the second down matrix includes column vectors having an odd weight.

According to another embodiment, a semiconductor device includes a parity generation circuit configured to generate a parity signal from an input data signal using a hamming code, a data storage circuit configured to store the input data signal and the parity signal during a write operation and configured to generate an output data signal and an output parity signal during a read operation, and a syndrome generation circuit configured to generate a syndrome signal for correcting errors of the output data signal from the output data signal and the output parity signal using the hamming code. The hamming code is realized by an error check matrix. The error check matrix includes a first sub-matrix and a second sub-matrix. The first sub-matrix includes a first up matrix, a first down matrix, a second up matrix and a second down matrix. The second sub-matrix includes a third up matrix, a third down matrix, a fourth up matrix and a fourth down matrix. Each of the first up matrix and the fourth down matrix includes column vectors having an even weight. Each of the first down matrix, the second up matrix, the second down matrix, the third up matrix, the third down matrix and the fourth up matrix includes column vectors having an odd weight.

According to another embodiment, there is provided a method of correcting data errors. The method includes generating a parity signal from an input data signal using a hamming code, storing the input data signal and the parity signal during a write operation, generating an output data signal and an output parity signal from the stored input data signal and the stored parity signal during a read operation, and generating a syndrome signal for correcting errors of the output data signal from the output data signal and the output parity signal using the hamming code. The hamming code is realized by an error check matrix. The error check matrix includes a first sub-matrix and a second sub-matrix. The first sub-matrix includes column vectors having an odd weight. The second sub-matrix includes an up matrix and a down matrix. Each of the up matrix and the down matrix includes column vectors having an odd weight.

BRIEF DESCRIPTION OF THE DRAWINGS

Various embodiments of the present disclosure will become more apparent in view of the attached drawings and accompanying detailed description, in which:

FIGS. 2 to 4 illustrate error check matrices for realizing error check codes in the semiconductor device of FIG. 1;

FIGS. 9 and 10 illustrate yet other error check matrices for realizing error check codes in the semiconductor device of FIG. 1;

FIGS. 11 and 12 illustrate still other error check matrices for realizing error check codes in the semiconductor device of FIG. 1.

DETAILED DESCRIPTION OF THE EMBODIMENTS

Various embodiments of the present disclosure will be described hereinafter with reference to the accompanying drawings. However, the embodiments described herein are for illustrative purposes only and are not intended to limit the scope of the present disclosure.

Figure 1:
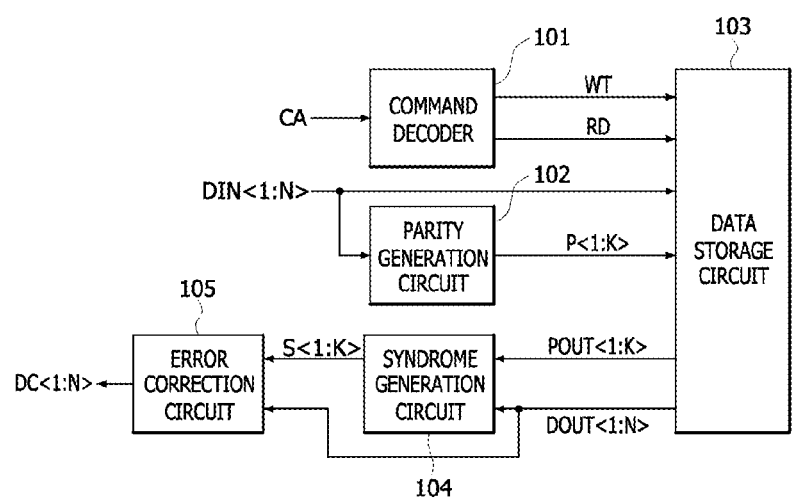
FIG. 1 is a block diagram illustrating a configuration of a semiconductor device according to an embodiment.

As illustrated in FIG. 1, a semiconductor device according to an embodiment may include a command decoder 101, a parity generation circuit 102, a data storage circuit 103, a syndrome generation circuit 104, and an error correction circuit 105.

The command decoder 101 may generate a write signal WT and a read signal RD in response to a command/address signal CA. The command decoder 101 may decode the command/address signal CA to generate the write signal WT and the read signal RD, one of which is selectively enabled. The command/address signal CA may be inputted to the command decoder 101 through a line that transmits a command and an address. The command/address signal CA may include a plurality of bits according to the embodiment. The write signal WT may be enabled for execution of a write operation, and the read signal RD may be enabled for execution of a read operation. Logic level combinations of bits included in the command/address signal CA for enabling the write signal WT and the read signal RD may be set differently according to the embodiment.

The parity generation circuit 102 may generate a parity signal P<1:K> from an input data signal DIN<1:N>. The parity generation circuit 102 may selectively execute a logic operation on some of the bits included in the input data signal DIN<1:N> to generate the parity signal P<1:K>. The parity signal P<1:K> may be generated using an error correction code (ECC) scheme which uses a Hamming code. The Hamming code may be realized by an error check matrix for correcting data errors. The error check matrix may be realized to include sub-matrices having column vectors, and each of the column vectors may have an odd weight or an even weight. An odd weight means that an odd number of bits have a value of '1', and an even weight means that an even number of bits have a value of '1'. The odd weight and the even weight of the sub-matrices included in the error check matrix may be set to control positions of bits which are erroneously corrected among the bits included in the data. The odd weight and the even weight of the sub-matrices included in the error check matrix may be set to be different according to the embodiment. Various embodiments in which the odd weight and the even weight of the sub-matrices included in the error check matrix are diversely set will be described later with reference to FIGS. 2 to 12.

The data storage circuit 103 may receive and store the input data signal DIN<1:N> and the parity signal P<1:K> in response to the write signal WT, and the data storage circuit 103 may output the input data signal DIN<1:N> and the parity signal P<1:K> as an output data signal DOUT<1:N> and an output parity signal POUT<1:K> in response to the read signal RD. The data storage circuit 103 may receive and store the input data signal DIN<1:N> and the parity signal P<1:K> if the write signal WT is enabled. The data storage circuit 103 may include storage circuits for storing the input data signal DIN<1:N> and the parity signal P<1:K>. The data storage circuit 103 may output the stored input data signal DIN<1:N> as the output data signal DOUT<1:N> and may output the stored parity signal P<1:K> as the output parity signal POUT<1:K>, if the read signal RD is enabled.

The syndrome generation circuit 104 may receive the output data signal DOUT<1:N> and the output parity signal POUT<1:K> to generate a syndrome signal S<1:K> which may be used for correcting errors of the output data signal DOUT<1:N> using a Hamming code. The syndrome signal S<1:K> may be generated by an ECC scheme using the Hamming code. The Hamming code may be realized by an error check matrix for correcting data errors. The error check matrix may be realized to include sub-matrices having column vectors, and each of the column vectors may have an odd weight or an even weight.

The error correction circuit 105 may correct errors included in the output data signal DOUT<1:N> to generate a corrected data signal DC<1:N> according to the syndrome signal S<1:K>. The number of erroneous bits of the output data signal DOUT<1:N> that can be corrected by the error correction circuit 105 may be set to be different according to the embodiment. The syndrome signal S<1:K> may have a logic level combination corresponding to a position of an error included in the output data signal DOUT<1:N>.

Figure 2:
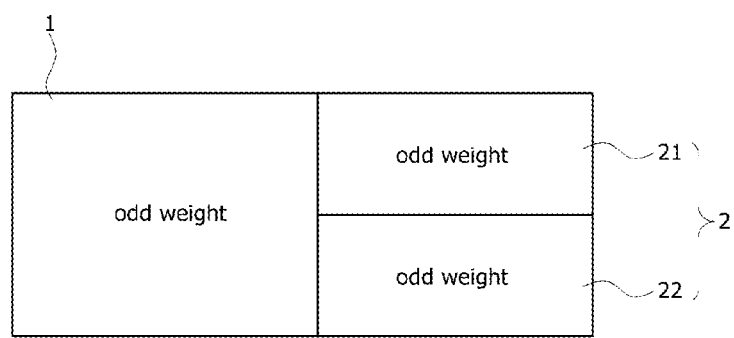

Referring to FIG. 2, an error check matrix according to an embodiment may include a first sub-matrix 1 and a second sub-matrix 2.

The first sub-matrix 1 may be realized to include column vectors having an odd weight. Each of the column vectors of the first sub-matrix 1 may be realized to have the same number of bits as the parity signal P<1:K>. That is, the number of bits included in each of the column vectors of the first sub-matrix 1 may be set equal to the number (K), where (K) is the number of bits included in the parity signal P<1:K>. A description that each of the column vectors of the first sub-matrix 1 are realized to have an odd weight means that the number of bits having a value of '1' among the bits included in each of the column vectors of the first sub-matrix 1 is set to be an odd number which is equal to or greater than three. A bit having a value of '1' may correspond to a bit having a logic "high" level, and a bit having a value of "0" may correspond to a bit having a logic "low" level. A case where the number of bits having a value of '1' among bits included in a column vector is one that may correspond to a case where the parity signal P<1:K> has an error. Thus, the column vector in which the number of bits having a value of '1' is one that may be excluded from the column vector of the first sub-matrix 1 of the error check matrix for checking errors of the data signal.

The second sub-matrix 2 may include an up matrix 21 and a down matrix 22. Column vectors of the up matrix 21 may be realized to have an odd weight, and column vectors of the down matrix 22 may also be realized to have an odd weight. Thus, an odd number of one or more bits having a value of '1' may be included in each of the column vectors of the up matrix 21 and the down matrix 22. A sum of the number of bits included in each of the column vectors of the up matrix 21 and the number of bits included in each of the column vectors of the down matrix 22 may be set equal to the number of bits included in each of the column vectors of the first sub-matrix 1.

The error check matrix includes the column vectors having logic level combinations which are different from each other.

FIG. 3 illustrates a maximum number of bits included in a row vector of the first sub-matrix 1 shown in FIG. 2 and a maximum number of bits included in row vectors of the second sub-matrix 2 shown in FIG. 2.

As illustrated in FIG. 3, the maximum number of bits included in each of the row vectors of the first sub-matrix 1 may be determined according to the number of bits included in the parity signal P<1:K>.

If the number of parity bits is four, the number of bits included in each of the column vectors of the first sub-matrix 1 may be set to be four. In addition, since the column vectors of the first sub-matrix 1 has an odd weight, the number of cases that each of the column vectors of the first sub-matrix 1 can be generated to include three bits (i.e., three elements) having a value of '1' may be four which is obtained by an equation of "4C3". That is, if the number of parity bits is four, the maximum number of bits included in each of the row vectors of the first sub-matrix 1 may be set to be four, where four corresponds to the number of cases that the column vectors of the first sub-matrix 1 can be generated. The number of bits included in each of the row vectors of the first sub-matrix 1 may be set to be one, two, three or four according to the embodiment.

If the number of parity bits is five, the number of bits included in each of the column vectors of the first sub-matrix 1 may be set to be five. In addition, since the column vectors of the first sub-matrix 1 has an odd weight, the number of cases that each of the column vectors of the first sub-matrix 1 can be generated to include three or five bits having a value of '1' may be eleven which is obtained by an equation of "5C3+5C5". That is, if the number of parity bits is five, the maximum number of bits included in each of the row vectors of the first sub-matrix 1 may be set to be eleven, where eleven corresponds to the number of cases that the column vectors of the first sub-matrix 1 can be generated. The number of bits included in each of the row vectors of the first sub-matrix 1 may be set to be any one of the natural numbers of one to eleven according to the embodiment.

If the number of parity bits is seven, the number of bits included in each of the column vectors of the first sub-matrix 1 may be set to be seven. In addition, since the column vectors of the first sub-matrix 1 has an odd weight, the number of cases that each of the column vectors of the first sub-matrix 1 can be generated to include three, five, or seven bits having a value of '1' may be fifty seven which is obtained by an equation of "7C3+7C5+7C7". That is, if the number of parity bits is seven, the maximum number of bits included in each of the row vectors of the first sub-matrix 1 may be set to be fifty seven, where fifty seven corresponds to the number of cases that the column vectors of the first sub-matrix 1 can be generated. The number of bits included in each of the row vectors of the first sub-matrix 1 may be set to be any one of the natural numbers of one to fifty seven according to the embodiment.

If the number of parity bits is eight, the number of bits included in each of the column vectors of the first sub-matrix 1 may be set to be eight. In addition, since the column vectors of the first sub-matrix 1 has an odd weight, the number of cases that each of the column vectors of the first sub-matrix 1 can be generated to include three, five, or seven bits having a value of '1' may be one hundred and twenty which is obtained by an equation of "8C3+8C5+8C7". That is, if the number of parity bits is eight, the maximum number of bits included in each of the row vectors of the first sub-matrix 1 may be set to be one hundred and twenty, where one hundred and twenty corresponds to the number of cases that the column vectors of the first sub-matrix 1 can be generated. The number of bits included in each of the row vectors of the first sub-matrix 1 may be set to be any one of the natural numbers of one to one hundred and twenty according to the embodiment.

As illustrated in FIG. 3, the maximum number of bits included in each of the row vectors of the second sub-matrix 2 may be set to be the product of the number of cases that the column vectors of the up matrix 21 can be generated and the number of cases that the column vectors of the down matrix 22 can be generated.

If the number of parity bits is four, the number of bits included in each of the column vectors of the up matrix 21 may be set to be two and the number of bits included in each of the column vectors of the down matrix 22 may be set to be two. Since the column vectors of the up matrix 21 has an odd weight, the number of cases that each of the column vectors of the up matrix 21 can be generated to include one bit having a value of '1' may be two which is obtained by an equation of "2C1". Since the column vectors of the down matrix 22 also has an odd weight, the number of cases that each of the column vectors of the down matrix 22 can be generated to include one bit having a value of '1' may be two which is obtained by an equation of "2C1". If the number of parity bits is four, the number of cases that each of the row vectors of the second sub-matrix 2 can be generated to include one bit having a value of '1' may be four (corresponding to the product of two by two) because the maximum number of bits included in each of the row vectors of the second sub-matrix 2 may be set to be the product of the number of cases that the column vectors of the up matrix 21 can be generated and the number of cases that the column vectors of the down matrix 22 can be generated. The number of bits included in each of the row vectors of the second sub-matrix 2 may be set to be one, two, three or four according to the embodiment.

If the number of parity bits is five, the number of bits included in each of the column vectors of the up matrix 21 may be set to be three and the number of bits included in each of the column vectors of the down matrix 22 may be set to be two. Since the column vectors of the up matrix 21 has an odd weight, the number of cases that each of the column vectors of the up matrix 21 can be generated to include one or three bits having a value of '1' may be four which is obtained by an equation of "3C1+3C3". Since the column vectors of the down matrix 22 also has an odd weight, the number of cases that each of the column vectors of the down matrix 22 can be generated to include one bit having a value of '1' may be two which is obtained by an equation of "2C1". If the number of parity bits is five, the maximum number of bits included in each of the row vectors of the second sub-matrix 2 may be set to be the product of the number of cases that the column vectors of the up matrix 21 can be generated and the number of cases that the column vectors of the down matrix 22 can be generated. Thus, the number of cases that the row vectors of the second sub-matrix 2 can be generated may be eight (corresponding to the product of four by two). The number of bits included in each of the row vectors of the second sub-matrix 2 may be set to be any one of the natural numbers of one to eight according to the embodiment.

If the number of parity bits is seven, the number of bits included in each of the column vectors of the up matrix 21 may be set to be five and the number of bits included in each of the column vectors of the down matrix 22 may be set to be two. Since the column vectors of the up matrix 21 has an odd weight, the number of cases that each of the column vectors of the up matrix 21 can be generated to include one, three or five bits having a value of '1' may be sixteen which is obtained by an equation of "5C1+5C3+5C5". Since the column vectors of the down matrix 22 also has an odd weight, the number of cases that each of the column vectors of the down matrix 22 can be generated to include one bit having a value of '1' may be two which is obtained by an equation of "2C1". If the number of parity bits is seven, the maximum number of bits included in each of the row vectors of the second sub-matrix 2 may be set to be the product of the number of cases that the column vectors of the up matrix 21 can be generated and the number of cases that the column vectors of the down matrix 22 can be generated. Thus, the number of cases that the row vectors of the second sub-matrix 2 can be generated may be thirty two (corresponding to the product of sixteen by two). The number of bits included in each of the row vectors of the second sub-matrix 2 may be set to be any one of the natural numbers of one to thirty two according to the embodiment.

If the number of parity bits is seven, the number of bits included in each of the column vectors of the up matrix 21 may be set to be four and the number of bits included in each of the column vectors of the down matrix 22 may be set to be three. Since the column vectors of the up matrix 21 has an odd weight, the number of cases that each of the column vectors of the up matrix 21 can be generated to include one or three bits having a value of '1' may be eight which is obtained by an equation of "4C1+4C3". Since the column vectors of the down matrix 22 also has an odd weight, the number of cases that each of the column vectors of the down matrix 22 can be generated to include one or three bits having a value of '1' may be four which is obtained by an equation of "3C1+3C3". If the number of parity bits is seven, the maximum number of bits included in each of the row vectors of the second sub-matrix 2 may be set to be the product of the number of cases that the column vectors of the up matrix 21 can be generated and the number of cases that the column vectors of the down matrix 22 can be generated. Thus, the number of cases that the row vectors of the second sub-matrix 2 can be generated may be thirty two (corresponding to the product of eight by four). The number of bits included in each of the row vectors of the second sub-matrix 2 may be set to be any one of the natural numbers of one to thirty two according to the embodiment.

If the number of parity bits is eight, the number of bits included in each of the column vectors of the up matrix 21 may be set to be five and the number of bits included in each of the column vectors of the down matrix 22 may be set to be three. Since the column vectors of the up matrix 21 has an odd weight, the number of cases that each of the column vectors of the up matrix 21 can be generated to include one, three or five bits having a value of '1' may be sixteen which is obtained by an equation of "5C1+5C3+5C5". Since the column vectors of the down matrix 22 also has an odd weight, the number of cases that each of the column vectors of the down matrix 22 can be generated to include one or three bits having a value of '1' may be four which is obtained by an equation of "3C1+3C3". If the number of parity bits is eight, the maximum number of bits included in each of the row vectors of the second sub-matrix 2 may be set to be the product of the number of cases that the column vectors of the up matrix 21 can be generated and the number of cases that the column vectors of the down matrix 22 can be generated. Thus, the number of cases that the row vectors of the second sub-matrix 2 can be generated may be sixty four (corresponding to the product of sixteen by four). The number of bits included in each of the row vectors of the second sub-matrix 2 may be set to be any one of the natural numbers of one to sixty four according to the embodiment.

If the number of parity bits is eight, the number of bits included in each of the column vectors of the up matrix 21 may be set to be four and the number of bits included in each of the column vectors of the down matrix 22 may be set to be four. Since the column vectors of the up matrix 21 has an odd weight, the number of cases that each of the column vectors of the up matrix 21 can be generated to include one or three bits having a value of '1' may be eight which is obtained by an equation of "4C1+4C3". Since the column vectors of the down matrix 22 also has an odd weight, the number of cases that each of the column vectors of the down matrix 22 can be generated to include one or three bits having a value of '1' may be eight which is obtained by an equation of "4C1+4C3". If the number of parity bits is eight, the maximum number of bits included in each of the row vectors of the second sub-matrix 2 may be set to be the product of the number of cases that the column vectors of the up matrix 21 can be generated and the number of cases that the column vectors of the down matrix 22 can be generated. Thus, the number of cases that the row vectors of the second sub-matrix 2 can be generated may be sixty four (corresponding to the product of eight by eight). The number of bits included in each of the row vectors of the second sub-matrix 2 may be set to be any one of the natural numbers of one to sixty four according to the embodiment.

FIG. 4 illustrates an error check matrix corresponding to a case that the number of the parity bits is four in the error check matrix of FIG. 2.

As illustrated in FIG. 4, the error check matrix may include a first sub-matrix 1a and a second sub-matrix 2a. The first sub-matrix 1a may include column vectors each having an odd weight. That is, a column vector of the first sub-matrix 1a, which is located in a first column line C1, may be set to have a column matrix form of $[1110]^T$, and a column vector of the first sub-matrix 1a, which is located in a second column line C2, may be set to have a column matrix form of $[0111]^T$. In addition, a column vector of the first sub-matrix 1a, which is located in a third column line C3, may be set to have a column matrix form of $[1011]^T$, and a column vector of the first sub-matrix 1a, which is located in a fourth column line C4, may be set to have a column matrix form of $[1101]^T$.

An up matrix 21a included in the second sub-matrix 2a may include column vectors each having an odd weight. That is, a column vector of the up matrix 21a, which is located in a fifth column line C5, may be set to have a column matrix form of $[10]^T$, and a column vector of the up matrix 21a, which is located in a sixth column line C6, may be set to have a column matrix form of $[01]^T$. In addition, a column vector of the up matrix 21a, which is located in a seventh column line C7, may be set to have a column matrix form of $[10]^T$, and a column vector of the up matrix 21a, which is located in an eighth column line C8, may be set to have a column matrix form of $[01]^T$.

A down matrix 22a included in the second sub-matrix 2a may include column vectors each having an odd weight. That is, a column vector of the down matrix 22a, which is located in the fifth column line C5, may be set to have a column matrix form of $[10]^T$, and a column vector of the down matrix 22a, which is located in the sixth column line C6, may be set to have a column matrix form of $[10]^T$. In addition, a column vector of the down matrix 22a, which is located in the seventh column line C7, may be set to have a column matrix form of $[01]^T$, and a column vector of the down matrix 22a, which is located in the eighth column line C8, may be set to have a column matrix form of $[01]^T$.

A row vector of the error check matrix, which is located in a first row line R1, may be set to have a row matrix form of [10111010], and a row vector of the error check matrix, which is located in a second row line R2, may be set to have a row matrix form of [11010101]. In addition, a row vector of the error check matrix, which is located in a third row line R3, may be set to have a row matrix form of [11101100], and a row vector of the error check matrix, which is located in a fourth row line R4, may be set to have a row matrix form of [01110011].

A parity signal and a syndrome signal may be generated using the error check matrix having the aforementioned configuration, and a position of an erroneous bit of data may be verified by comparing column vectors of the error check matrix with the syndrome signal. For example, if the syndrome signal is generated to have a logic level combination of '0111', a second bit among the bits included in the data may be regarded as an erroneous bit because the syndrome signal is consistent with the column vector of the first sub-matrix 1a, which is located in the second column line C2. If at least two erroneous bits are included in the data, the syndrome signal may be generated by exclusive OR operations of a plurality of column vectors included in the error check matrix. For example, if a first bit and a third bit of the data are erroneous bits, the syndrome signal may be generated to have a logic level combination of '0101' by executing an exclusive OR operation of the column vector ($[1110]^T$) located in the first column line C1 of the first sub-matrix 1a and the column vector ($[1011]^T$) located in the third column line C3 of the first sub-matrix 1a. Since the logic level combination of '0101' is consistent with the column vector ($[0101]^T$) located in the eighth column line C8 of the second sub-matrix 2a, an eighth bit of the data may be erroneously corrected. Meanwhile, even though two bits among the fifth to eighth bits of the data are erroneous bits, a phenomenon that bits of the data are erroneously corrected may possibly not occur. This is because a logic level combination generated by an exclusive OR operation of any two column vectors of the second sub-matrix 2a is inconsistent with the column vectors included in the first and second sub-matrices 1a and 2a. In other words, this is because the column vectors of the second sub-matrix 2a have an even weight if the column vectors of the up matrix 21a and the down matrix 22a have an odd weight, and because column vectors generated by exclusive OR operations of the column vectors having an even weight have only an even weight.

As described above, if the error check matrix according to the embodiment is used to correct errors of the data, the first to fourth bits among the bits included in the data are not erroneously corrected even though two erroneous bits are included in the data. That is, the data bits included in the first sub-matrix 1a may not, for example, be erroneously corrected by two erroneous bits of the data. Accordingly, the data bits included in the first sub-matrix 1a may not, for example, be erroneously corrected even though two erroneous bits are included in the data of the second sub-matrix 2a.

Figure 5:
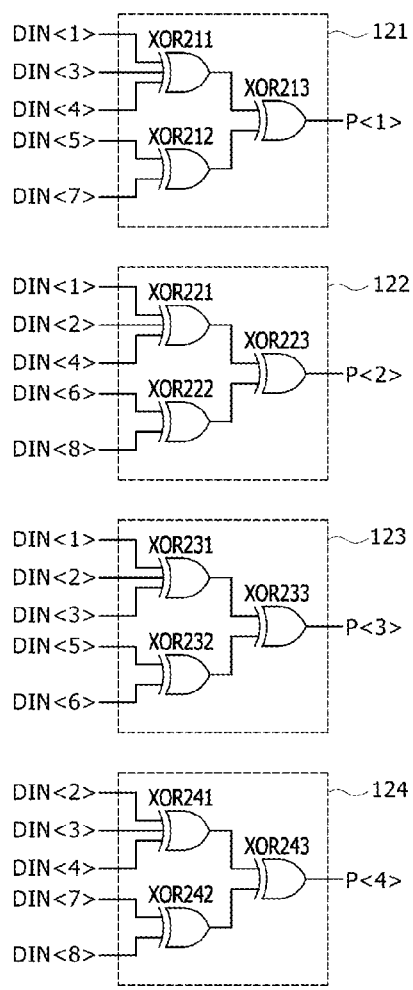
FIG. 5 is a circuit diagram illustrating a parity generation circuit included in the semiconductor device of FIG. 1.

Referring to FIG. 5, the parity generation circuit 102 may include a first parity generation circuit 121, a second parity generation circuit 122, a third parity generation circuit 123, and a fourth parity generation circuit 124.

The first parity generation circuit 121 may include exclusive OR gates XOR211, XOR212 and XOR213. In the error check matrix illustrated in FIG. 4, since the row vector located in the first row line R1 is set to have a row matrix form of [10111010], the first parity P<1> may be generated by exclusive OR operations of the first input data DIN<1>, the third input data DIN<3>, the fourth input data DIN<4>, the fifth input data DIN<5> and the seventh input data DIN<7>.

The second parity generation circuit 122 may include exclusive OR gates XOR221, XOR222 and XOR223. In the error check matrix illustrated in FIG. 4, since the row vector located in the second row line R2 is set to have a row matrix form of [11010101], the second parity P<2> may be generated by exclusive OR operations of the first input data DIN<1>, the second input data DIN<2>, the fourth input data DIN<4>, the sixth input data DIN<6> and the eighth input data DIN<8>.

The third parity generation circuit 123 may include exclusive OR gates XOR231, XOR232 and XOR233. In the error check matrix illustrated in FIG. 4, since the row vector located in the third row line R3 is set to have a row matrix form of [11101100], the third parity P<3> may be generated by exclusive OR operations of the first input data DIN<1>, the second input data DIN<2>, the third input data DIN<3>, the fifth input data DIN<5> and the sixth input data DIN<6>.

The fourth parity generation circuit 124 may include exclusive OR gates XOR241, XOR242 and XOR243. In the error check matrix illustrated in FIG. 4, since the row vector located in the fourth row line R4 is set to have a row matrix form of [01110011], the fourth parity P<4> may be generated by exclusive OR operations of the second input data DIN<2>, the third input data DIN<3>, the fourth input data DIN<4>, the seventh input data DIN<7> and the eighth input data DIN<8>.

Figure 6:
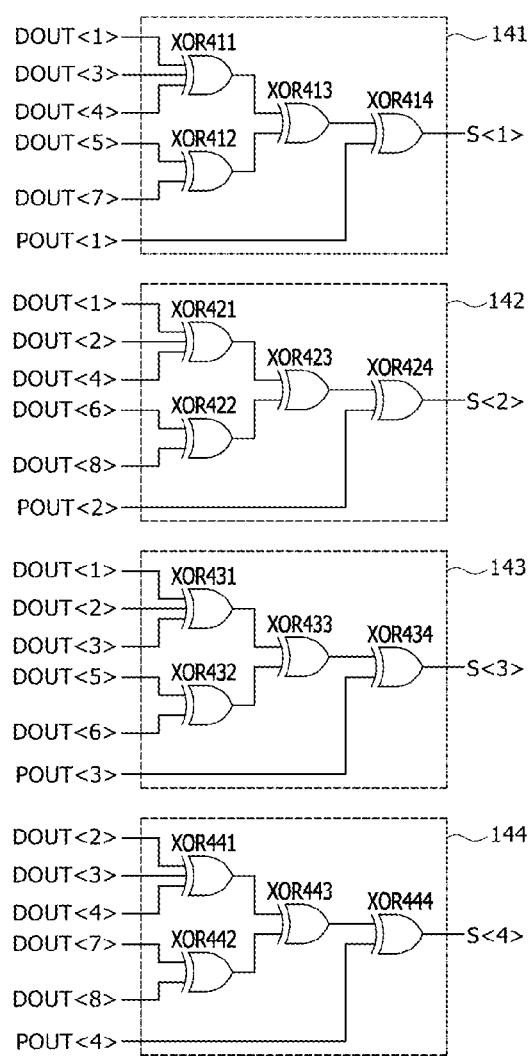
FIG. 6 is a circuit diagram illustrating a syndrome generation circuit included in the semiconductor device of FIG. 1.

Referring to FIG. 6, the syndrome generation circuit 104 may include a first internal syndrome generation circuit 141, a second internal syndrome generation circuit 142, a third internal syndrome generation circuit 143 and a fourth internal syndrome generation circuit 144.

The first internal syndrome generation circuit 141 may include exclusive OR gates XOR411, XOR412, XOR413 and XOR 414. In the error check matrix illustrated in FIG. 4, since the row vector located in the first row line R1 is set to have a row matrix form of [10111010], the first syndrome S<1> may be generated by exclusive OR operations of the first output data DOUT<1>, the third output data DOUT<3>, the fourth output data DOUT<4>, the fifth output data DOUT<5>, the seventh output data DOUT<7> and the first output parity P<1>.

The second internal syndrome generation circuit 142 may include exclusive OR gates XOR421, XOR422, XOR423 and XOR 424. In the error check matrix illustrated in FIG.

4, since the row vector located in the second row line R2 is set to have a row matrix form of [11010101], the second syndrome S<2> may be generated by exclusive OR operations of the first output data DOUT<1>, the second output data DOUT<2>, the fourth output data DOUT<4>, the sixth output data DOUT<6>, the eighth output data DOUT<8> and the second output parity P<2>.

The third internal syndrome generation circuit 143 may include exclusive OR gates XOR431, XOR432, XOR433 and XOR 434. In the error check matrix illustrated in FIG. 4, since the row vector located in the third row line R3 is set to have a row matrix form of [11101100], the third syndrome S<3> may be generated by exclusive OR operations of the first output data DOUT<1>, the second output data DOUT<2>, the third output data DOUT<3>, the fifth output data DOUT<5>, the sixth output data DOUT<6> and the third output parity P<3>.

The fourth internal syndrome generation circuit 144 may include exclusive OR gates XOR441, XOR442, XOR443 and XOR 444. In the error check matrix illustrated in FIG. 4, since the row vector located in the fourth row line R4 is set to have a row matrix form of [01110011], the fourth syndrome S<4> may be generated by exclusive OR operations of the second output data DOUT<2>, the third output data DOUT<3>, the fourth output data DOUT<4>, the seventh output data DOUT<7>, the eighth output data DOUT<8> and the fourth output parity P<4>.

Figure 7:
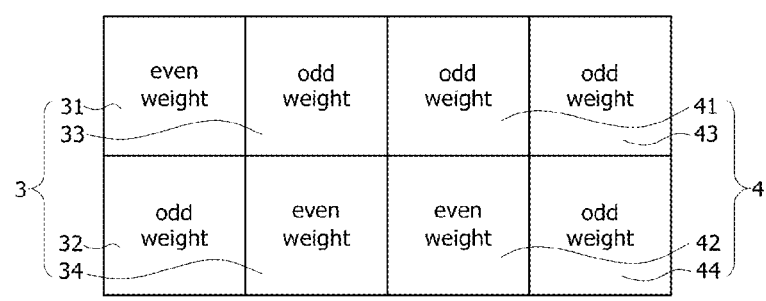
FIGS. 7 and 8 illustrate other error check matrices for realizing error check codes in the semiconductor device of FIG. 1.

Referring to FIG. 7, an error check matrix according to another embodiment may include a first sub-matrix 3 and a second sub-matrix 4.

The first sub-matrix 3 may include a first up matrix 31, a first down matrix 32, a second up matrix 33 and a second down matrix 34. The first up matrix 31 may be realized to include column vectors each having an even weight, and the first down matrix 32 may be realized to include column vectors each having an odd weight. In addition, the second up matrix 33 may be realized to include column vectors each having an odd weight, and the second down matrix 34 may be realized to include column vectors each having an even weight. Each of the column vectors of the first up matrix 31 and the second down matrix 34 may include an even number of bits (i.e., even number of elements) having a value of '1'. Each of the column vectors of the first down matrix 32 and the second up matrix 33 may include an odd number of one or more bits (i.e., odd number of elements) having a value of '1'. A sum of the number of bits included in each column vector of the first up matrix 31 and the number of bits included in each column vector of the first down matrix 32 may be set equal to the number of bits included in the parity signal. A sum of the number of bits included in each column vector of the second up matrix 33 and the number of bits included in each column vector of the second down matrix 34 may be set equal to the number of bits included in the parity signal. The column vectors of the first sub-matrix 3 may be realized to have an odd weight.

The second sub-matrix 4 may include a third up matrix 41, a third down matrix 42, a fourth up matrix 43 and a fourth down matrix 44. The third up matrix 41 may be realized to include column vectors each having an odd weight, and the third down matrix 42 may be realized to include column vectors each having an even weight. In addition, the fourth up matrix 43 may be realized to include column vectors each having an odd weight, and the fourth down matrix 44 may be realized to include column vectors each having an odd weight. Each of the column vectors of the third down matrix 42 may include an even number of one or more bits (i.e., even number of elements) having a value of '1'. Each of the column vectors of the third up matrix 41, the fourth up matrix 43 and the fourth down matrix 44 may include an odd number of one or more bits (i.e., odd number of elements) having a value of '1'. A sum of the number of bits included in each column vector of the third up matrix 41 and the number of bits included in each column vector of the third down matrix 42 may be set equal to the number of bits included in the parity signal. A sum of the number of bits included in each column vector of the fourth up matrix 43 and the number of bits included in each column vector of the fourth down matrix 44 may be set equal to the number of bits included in the parity signal.

Figure 8:
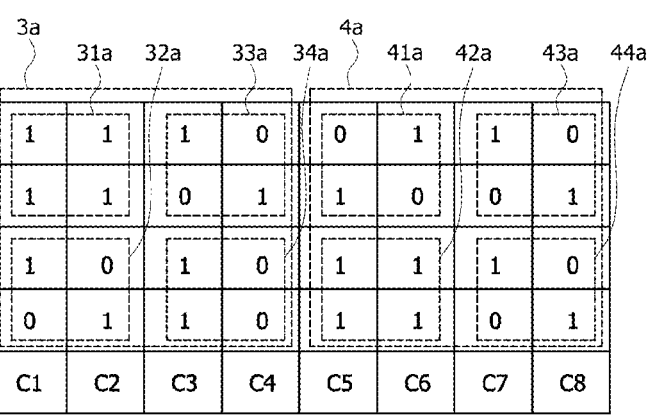

FIG. 8 illustrates an error check matrix corresponding to a case that the number of the parity bits is four in the error check matrix of FIG. 7.

As illustrated in FIG. 8, the error check matrix may include a first sub-matrix 3a and a second sub-matrix 4a.

A first up matrix 31a included in the first sub-matrix 3a may include column vectors each having an even weight. That is, a column vector of the first up matrix 31a, which is located in a first column line C1, may be set to have a column matrix form of $[11]^T$, and a column vector of the first up matrix 31a, which is located in a second column line C2, may be set to have a column matrix form of $[11]^T$.

A first down matrix 32a included in the first sub-matrix 3a may include column vectors each having an odd weight. That is, a column vector of the first down matrix 32a, which is located in the first column line C1, may be set to have a column matrix form of $[10]^T$, and a column vector of the first down matrix 32a, which is located in the second column line C2, may be set to have a column matrix form of $[01]^T$.

A second up matrix 33a included in the first sub-matrix 3a may include column vectors each having an odd weight. That is, a column vector of the second up matrix 33a, which is located in a third column line C3, may be set to have a column matrix form of $[10]^T$, and a column vector of the second up matrix 33a, which is located in a fourth column line C4, may be set to have a column matrix form of $[01]^T$.

A second down matrix 34a included in the first sub-matrix 3a may include column vectors each having an even weight. That is, a column vector of the second down matrix 34a, which is located in the third column line C3, may be set to have a column matrix form of $[11]^T$, and a column vector of the second down matrix 34a, which is located in the fourth column line C4, may be set to have a column matrix form of $[00]^T$.

A third up matrix 41a included in the second sub-matrix 4a may include column vectors each having an odd weight. That is, a column vector of the third up matrix 41a, which is located in a fifth column line C5, may be set to have a column matrix form of $[01]^T$, and a column vector of the third up matrix 41a, which is located in a sixth column line C6, may be set to have a column matrix form of $[10]^T$.

A third down matrix 42a included in the second sub-matrix 4a may include column vectors each having an even weight. That is, a column vector of the third down matrix 42a, which is located in the fifth column line C5, may be set to have a column matrix form of $[11]^T$, and a column vector of the third down matrix 42a, which is located in the sixth column line C6, may be set to have a column matrix form of $[11]^T$.

A fourth up matrix 43a included in the second sub-matrix 4a may include column vectors each having an odd weight. That is, a column vector of the fourth up matrix 43a, which is located in a seventh column line C7, may be set to have a column matrix form of $[10]^T$, and a column vector of the fourth up matrix 43a, which is located in an eighth column line C8, may be set to have a column matrix form of $[01]^T$.

A fourth down matrix 44a included in the second sub-matrix 4a may include column vectors each having an odd weight. That is, a column vector of the fourth down matrix 44a, which is located in the seventh column line C7, may be set to have a column matrix form of $[10]^T$, and a column vector of the fourth down matrix 44a, which is located in the eighth column line C8, may be set to have a column matrix form of $[01]^T$.

A row vector of the error check matrix, which is located in a first row line R1, may be set to have a row matrix form of [11100110], and a row vector of the error check matrix, which is located in a second row line R2, may be set to have a row matrix form of [11011001]. In addition, a row vector of the error check matrix, which is located in a third row line R3, may be set to have a row matrix form of [10101110], and a row vector of the error check matrix, which is located in a fourth row line R4, may be set to have a row matrix form of [01101101].

If at least two erroneous bits are included in the data, a syndrome signal may be generated by exclusive OR operations of a plurality of column vectors included in the error check matrix. For example, if a first bit and a third bit of the data are erroneous bits, the syndrome signal may be generated to have a logic level combination of '0101' by executing an exclusive OR operation of the column vector ($[1110]^T$) located in the first column line C1 of the first sub-matrix 3a and the column vector ($[1011]^T$) located in the third column line C3 of the first sub-matrix 3a. Since the logic level combination of '0101' is consistent with the column vector ($[0101]^T$) located in the eighth column line C8 of the second sub-matrix 4a, an eighth bit of the data may be erroneously corrected. Meanwhile, even though sixth and eighth bits among the bits of the data are erroneous bits, the syndrome signal may be generated to have a logic level combination of '1110' by executing an exclusive OR operation of the column vector ($[1011]^T$) located in the sixth column line C6 and the column vector ($[0101]^T$) located in the eighth column line C8. Since the logic level combination of '1110' is consistent with the column vector ($[1110]^T$) located in the first column line C1, a first bit of the data may be erroneously corrected.

As described above, if the error check matrix according to the above embodiment is used to correct errors of the data, positions of bits which are erroneously corrected may be controlled when two erroneous bits are included in the data. That is, if two erroneous bits exist in the first sub-matrix 3a, erroneous correction of a data bit of the first sub-matrix 3a may be prevented while a data bit of the second sub-matrix 4a is erroneously corrected. In addition, if two erroneous bits exist in the second sub-matrix 4a, erroneous correction of a data bit of the second sub-matrix 4a may be prevented while a data bit of the first sub-matrix 3a is erroneously corrected.

Figure 9:
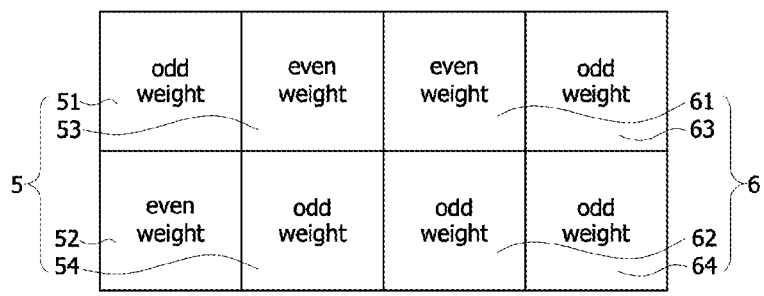

Referring to FIG. 9, an error check matrix according to yet another embodiment may include a first sub-matrix 5 and a second sub-matrix 6.

The first sub-matrix 5 may include a first up matrix 51, a first down matrix 52, a second up matrix 53 and a second down matrix 54. The first up matrix 51 may be realized to include column vectors each having an odd weight, and the first down matrix 52 may be realized to include column vectors each having an even weight. In addition, the second up matrix 53 may be realized to include column vectors each having an even weight, and the second down matrix 54 may be realized to include column vectors each having an odd weight. Each of the column vectors of the first down matrix 52 and the second up matrix 53 may include an even number of one or more bits (i.e., even number of elements) having a value of '1'. Each of the column vectors of the first up matrix 51 and the second down matrix 54 may include an odd number of one or more bits (i.e., odd number of elements) having a value of '1'. A sum of the number of bits included in each column vector of the first up matrix 51 and the number of bits included in each column vector of the first down matrix 52 may be set equal to the number of bits included in the parity signal. A sum of the number of bits included in each column vector of the second up matrix 53 and the number of bits included in each column vector of the second down matrix 54 may be set equal to the number of bits included in the parity signal. The column vectors of the first sub-matrix 5 may be realized to have an odd weight.

The second sub-matrix 6 may include a third up matrix 61, a third down matrix 62, a fourth up matrix 63 and a fourth down matrix 64. The third up matrix 61 may be realized to include column vectors each having an even weight, and the third down matrix 62 may be realized to include column vectors each having an odd weight. In addition, the fourth up matrix 63 may be realized to include column vectors each having an odd weight, and the fourth down matrix 64 may be realized to include column vectors each having an odd weight. Each of the column vectors of the third up matrix 61 may include an even number of one or more bits (i.e., even number of elements) having a value of '1'. Each of the column vectors of the third down matrix 62, the fourth up matrix 63 and the fourth down matrix 64 may include an odd number of one or more bits (i.e., odd number of elements) having a value of '1'. A sum of the number of bits included in each column vector of the third up matrix 61 and the number of bits included in each column vector of the third down matrix 62 may be set equal to the number of bits included in the parity signal. A sum of the number of bits included in each column vector of the fourth up matrix 63 and the number of bits included in each column vector of the fourth down matrix 64 may be set equal to the number of bits included in the parity signal.

FIG. 10 illustrates an error check matrix corresponding to a case that the number of the parity bits is four in the error check matrix of FIG. 9.

As illustrated in FIG. 10, the error check matrix may include a first sub-matrix 5a and a second sub-matrix 6a.

A first up matrix 51a included in the first sub-matrix 5a may include column vectors each having an odd weight. That is, a column vector of the first up matrix 51a, which is located in a first column line C1, may be set to have a column matrix form of $[10]^T$, and a column vector of the first up matrix 51a, which is located in a second column line C2, may be set to have a column matrix form of $[01]^T$.

A first down matrix 52a included in the first sub-matrix 5a may include column vectors each having an even weight. That is, a column vector of the first down matrix 52a, which is located in the first column line C1, may be set to have a column matrix form of $[11]^T$, and a column vector of the first down matrix 52a, which is located in the second column line C2, may be set to have a column matrix form of $[11]^T$.

A second up matrix 53a included in the first sub-matrix 5a may include column vectors each having an even weight. That is, a column vector of the second up matrix 53a, which is located in a third column line C3, may be set to have a column matrix form of $[11]^T$, and a column vector of the second up matrix 53a, which is located in a fourth column line C4, may be set to have a column matrix form of $[00]^T$.

A second down matrix 54a included in the first sub-matrix 5a may include column vectors each having an odd weight. That is, a column vector of the second down matrix 54a, which is located in the third column line C3, may be set to have a column matrix form of $[10]^T$, and a column vector of the second down matrix 54a, which is located in the fourth column line C4, may be set to have a column matrix form of $[01]^T$.

A third up matrix 61a included in the second sub-matrix 6a may include column vectors each having an even weight. That is, a column vector of the third up matrix 61a, which is located in a fifth column line C5, may be set to have a column matrix form of $[11]^T$, and a column vector of the third up matrix 61a, which is located in a sixth column line C6, may be set to have a column matrix form of $[11]^T$.

A third down matrix 62a included in the second sub-matrix 6a may include column vectors each having an odd weight. That is, a column vector of the third down matrix 62a, which is located in the fifth column line C5, may be set to have a column matrix form of $[01]^T$, and a column vector of the third down matrix 62a, which is located in the sixth column line C6, may be set to have a column matrix form of $[10]^T$.

A fourth up matrix 63a included in the second sub-matrix 6a may include column vectors each having an odd weight. That is, a column vector of the fourth up matrix 63a, which is located in a seventh column line C7, may be set to have a column matrix form of $[10]^T$, and a column vector of the fourth up matrix 63a, which is located in an eighth column line C8, may be set to have a column matrix form of $[01]^T$.

A fourth down matrix 64a included in the second sub-matrix 6a may include column vectors each having an odd weight. That is, a column vector of the fourth down matrix 64a, which is located in the seventh column line C7, may be set to have a column matrix form of $[10]^T$, and a column vector of the fourth down matrix 64a, which is located in the eighth column line C8, may be set to have a column matrix form of $[01]^T$.

A row vector of the error check matrix, which is located in a first row line R1, may be set to have a row matrix form of [10101110], and a row vector of the error check matrix, which is located in a second row line R2, may be set to have a row matrix form of [01101101]. In addition, a row vector of the error check matrix, which is located in a third row line R3, may be set to have a row matrix form of [11100110], and a row vector of the error check matrix, which is located in a fourth row line R4, may be set to have a row matrix form of [11011001].

If at least two erroneous bits are included in the data, a syndrome signal may be generated by exclusive OR operations of a plurality of column vectors included in the error check matrix. For example, if a first bit and a third bit of the data are erroneous bits, the syndrome signal may be generated to have a logic level combination of '0101' by executing an exclusive OR operation of the column vector ($[1011]^T$) located in the first column line C1 of the first sub-matrix 5a and the column vector ($[1110]^T$) located in the third column line C3 of the first sub-matrix 5a. Since the logic level combination of '0101' is consistent with the column vector ($[0101]^T$) located in the eighth column line C8 of the second sub-matrix 6a, an eighth bit of the data may be erroneously corrected. Meanwhile, even though sixth and eighth bits among the bits of the data are erroneous bits, the syndrome signal may be generated to have a logic level combination of '1011' by executing an exclusive OR operation of the column vector ($[1110]^T$) located in the sixth column line C6 and the column vector ($[0101]^T$) located in the eighth column line C8. Since the logic level combination of '1011' is consistent with the column vector ($[1011]^T$) located in the first column line C1, a first bit of the data may be erroneously corrected.

As described above, if the error check matrix according to the above embodiment is used to correct errors of the data, positions of bits which are erroneously corrected may be controlled when two erroneous bits are included in the data. That is, if two erroneous bits exist in the first sub-matrix 5a, erroneous correction of a data bit of the first sub-matrix 5a may be prevented while a data bit of the second sub-matrix 6a is erroneously corrected. In addition, if two erroneous bits exist in the second sub-matrix 6a, erroneous correction of a data bit of the second sub-matrix 6a may be prevented while a data bit of the first sub-matrix 5a is erroneously corrected.

Figure 11:
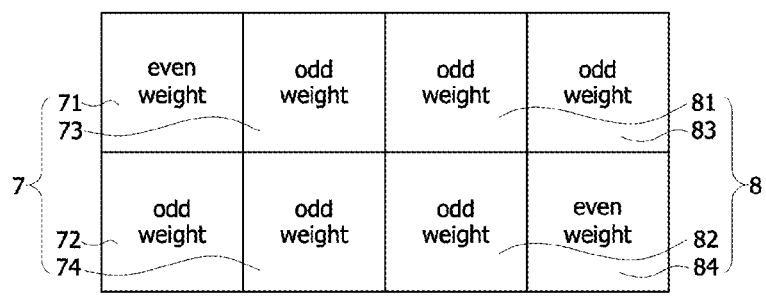

Referring to FIG. 11, an error check matrix according to still another embodiment may include a first sub-matrix 7 and a second sub-matrix 8.

The first sub-matrix 7 may include a first up matrix 71, a first down matrix 72, a second up matrix 73 and a second down matrix 74. The first up matrix 71 may be realized to include column vectors each having an even weight, and the first down matrix 72 may be realized to include column vectors each having an odd weight. In addition, the second up matrix 73 may be realized to include column vectors each having an odd weight, and the second down matrix 74 may be realized to include column vectors each having an odd weight. Each of the column vectors of the first up matrix 71 may include an even number of one or more bits (i.e., even number of elements) having a value of '1'. Each of the column vectors of the first down matrix 72, the second up matrix 73 and the second down matrix 74 may include an odd number of one or more bits (i.e., odd number of elements) having a value of '1'. A sum of the number of bits included in each column vector of the first up matrix 71 and the number of bits included in each column vector of the first down matrix 72 may be set equal to the number of bits included in the parity signal. A sum of the number of bits included in each column vector of the second up matrix 73 and the number of bits included in each column vector of the second down matrix 74 may be set equal to the number of bits included in the parity signal.

The second sub-matrix 8 may include a third up matrix 81, a third down matrix 82, a fourth up matrix 83 and a fourth down matrix 84. The third up matrix 81 may be realized to include column vectors each having an odd weight, and the third down matrix 82 may be realized to include column vectors each having an odd weight. In addition, the fourth up matrix 83 may be realized to include column vectors each having an odd weight, and the fourth down matrix 84 may be realized to include column vectors each having an even weight. Each of the column vectors of the fourth down matrix 84 may include an even number of one or more bits (i.e., even number of elements) having a value of '1'. Each of the column vectors of the third up matrix 81, the third down matrix 82 and the fourth up matrix 83 may include an odd number of one or more bits (i.e., odd number of elements) having a value of '1'. A sum of the number of bits included in each column vector of the third up matrix 81 and the number of bits included in each column vector of the third down matrix 82 may be set equal to the number of bits included in the parity signal. A sum of the number of bits included in each column vector of the fourth up matrix 83 and the number of bits included in each column vector of the fourth down matrix 84 may be set equal to the number of bits included in the parity signal.

FIG. 12 illustrates an error check matrix corresponding to a case that the number of the parity bits is four in the error check matrix of FIG. 11.

As illustrated in FIG. 12, the error check matrix may include a first sub-matrix 7a and a second sub-matrix 8a.

A first up matrix 71a included in the first sub-matrix 7a may include column vectors each having an even weight. That is, a column vector of the first up matrix 71a, which is located in a first column line C1, may be set to have a column matrix form of $[11]^T$, and a column vector of the first up matrix 71a, which is located in a second column line C2, may be set to have a column matrix form of $[11]^T$.

A first down matrix 72a included in the first sub-matrix 7a may include column vectors each having an odd weight. That is, a column vector of the first down matrix 72a, which is located in the first column line C1, may be set to have a column matrix form of $[10]^T$, and a column vector of the first down matrix 72a, which is located in the second column line C2, may be set to have a column matrix form of $[01]^T$.

A second up matrix 73a included in the first sub-matrix 7a may include column vectors each having an odd weight. That is, a column vector of the second up matrix 73a, which is located in a third column line C3, may be set to have a column matrix form of $[10]^T$, and a column vector of the second up matrix 73a, which is located in a fourth column line C4, may be set to have a column matrix form of $[01]^T$.

A second down matrix 74a included in the first sub-matrix 7a may include column vectors each having an odd weight. That is, a column vector of the second down matrix 74a, which is located in the third column line C3, may be set to have a column matrix form of $[01]^T$, and a column vector of the second down matrix 74a, which is located in the fourth column line C4, may be set to have a column matrix form of $[10]^T$.

A third up matrix 81a included in the second sub-matrix 8a may include column vectors each having an odd weight. That is, a column vector of the third up matrix 81a, which is located in a fifth column line C5, may be set to have a column matrix form of $[01]^T$, and a column vector of the third up matrix 81a, which is located in a sixth column line C6, may be set to have a column matrix form of $[10]^T$.

A third down matrix 82a included in the second sub-matrix 8a may include column vectors each having an odd weight. That is, a column vector of the third down matrix 82a, which is located in the fifth column line C5, may be set to have a column matrix form of $[01]^T$, and a column vector of the third down matrix 82a, which is located in the sixth column line C6, may be set to have a column matrix form of $[01]^T$.

A fourth up matrix 83a included in the second sub-matrix 8a may include column vectors each having an odd weight. That is, a column vector of the fourth up matrix 83a, which is located in a seventh column line C7, may be set to have a column matrix form of $[10]^T$, and a column vector of the fourth up matrix 83a, which is located in an eighth column line C8, may be set to have a column matrix form of $[01]^T$.

A fourth down matrix 84a included in the second sub-matrix 8a may include column vectors each having an even weight. That is, a column vector of the fourth down matrix 84a, which is located in the seventh column line C7, may be set to have a column matrix form of $[11]^T$, and a column vector of the fourth down matrix 84a, which is located in the eighth column line C8, may be set to have a column matrix form of $[11]^T$.

A row vector of the error check matrix, which is located in a first row line R1, may be set to have a row matrix form of [11100110], and a row vector of the error check matrix, which is located in a second row line R2, may be set to have a row matrix form of [11011001]. In addition, a row vector of the error check matrix, which is located in a third row line R3, may be set to have a row matrix form of [10010011], and a row vector of the error check matrix, which is located in a fourth row line R4, may be set to have a row matrix form of [01101111].

If at least two erroneous bits are included in the data, a syndrome signal may be generated by exclusive OR operations of a plurality of column vectors included in the error check matrix. For example, if a first bit and a third bit of the data are erroneous bits, the syndrome signal may be generated to have a logic level combination of '0111' by executing an exclusive OR operation of the column vector ($[1110]^T$) located in the first column line C1 of the first sub-matrix 7a and the column vector ($[1001]^T$) located in the third column line C3 of the first sub-matrix 7a. Since the logic level combination of '0111' is consistent with the column vector ($[0111]^T$) located in the eighth column line C8 of the second sub-matrix 8a, an eighth bit of the data may be erroneously corrected. Meanwhile, even though sixth and eighth bits among the bits of the data are erroneous bits, the syndrome signal may be generated to have a logic level combination of '1110' by executing an exclusive OR operation of the column vector ($[1001]^T$) located in the sixth column line C6 and the column vector ($[0111]^T$) located in the eighth column line C8. Since the logic level combination of '1110' is consistent with the column vector ($[1110]^T$) located in the first column line C1, a first bit of the data may be erroneously corrected.

As described above, if the error check matrix according to the above embodiment is used to correct data errors, positions of bits which are erroneously corrected may be controlled when two erroneous bits are included in the data. That is, if two erroneous bits exist in the first sub-matrix 7a, erroneous correction of a data bit of the first sub-matrix 7a may be prevented while a data bit of the second sub-matrix 8a is erroneously corrected. In addition, if two erroneous bits exist in the second sub-matrix 8a, erroneous correction of a data bit of the second sub-matrix 8a may be prevented while a data bit of the first sub-matrix 7a is erroneously corrected.

Figure 13:
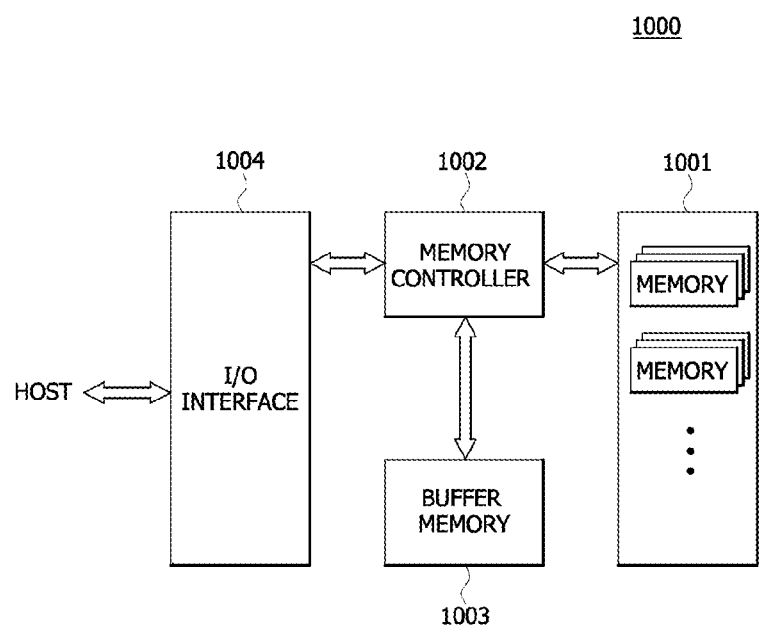
FIGS. 13 and 14 are block diagrams illustrating configurations of semiconductor systems employing the semiconductor device shown in FIG. 1.

The semiconductor device described with reference to FIG. 1 may be applied to an electronic system that includes a memory system, a graphic system, a computing system, a mobile system, and the like. For example, as illustrated in FIG. 13, an electronic system 1000 according an embodiment may include a data storage circuit 1001, a memory controller 1002, a buffer memory 1003, and an input/output (I/O) interface 1004.

The data storage circuit 1001 may store data which is outputted from the memory controller 1002 or may read and output the stored data to the memory controller 1002, according to a control signal generated from the memory controller 1002. The data storage circuit 1001 may include the semiconductor device illustrated in FIG. 1. Meanwhile, the data storage circuit 1001 may include a nonvolatile memory that can retain its stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device)

through the I/O interface 1004 and may decode the command outputted from the host device to control an operation for inputting data into the data storage circuit 1001 or the buffer memory 1003 or for outputting data stored in the data storage circuit 1001 or the buffer memory 1003. Although FIG. 13 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store data which is processed by the memory controller 1002. That is, the buffer memory 1003 may temporarily store data which is outputted from or to be inputted to the data storage circuit 1001. The buffer memory 1003 may store data, which is outputted from the memory controller 1002, according to a control signal. The buffer memory 1003 may read and output stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multimedia card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

Figure 14:
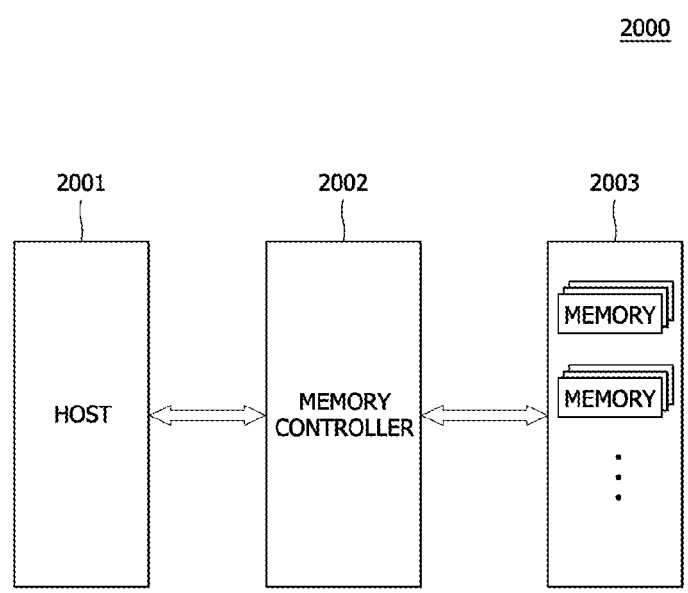

Referring to FIG. 14, an electronic system 2000 according another embodiment may include a host 2001, a memory controller 2002 and a data storage circuit 2003.

The host 2001 may output a request signal and data to the memory controller 2002 to access the data storage circuit 2003. The memory controller 2002 may supply the data, a data strobe signal, a command, addresses and a clock signal to the data storage circuit 2003 in response to the request signal, and the data storage circuit 2003 may execute a write operation or a read operation in response to the command. The host 2001 may transmit the data to the memory controller 2002 to store the data into the data storage circuit 2003. In addition, the host 2001 may receive the data outputted from the data storage circuit 2003 through the memory controller 2002. The host 2001 may include a circuit that corrects errors of the data using an error correction code (ECC) scheme.

The memory controller 2002 may act as an interface that connects the host 2001 to the data storage circuit 2003 for communication between the host 2001 and the data storage circuit 2003. The memory controller 2002 may receive the request signal and the data outputted from the host 2001 and may generate and supply the data, the data strobe signal, the command, the addresses and the clock signal to the data storage circuit 2003 in order to control operations of the data storage circuit 2003. In addition, the memory controller 2002 may supply the data outputted from the data storage circuit 2003 to the host 2001.

The data storage circuit 2003 may include a plurality of memories. The data storage circuit 2003 may receive the data, the data strobe signal, the command, the addresses and the clock signal from the memory controller 2002 to execute the write operation or the read operation. Each of the memories included in the data storage circuit 2003 may include a circuit that corrects errors of the data using an error correction code (ECC) scheme.

In some embodiments, the electronic system 2000 may be realized to selectively operate any one of the ECC circuits included in the host 2001 and the data storage circuit 2003. Alternatively, the electronic system 2000 may be realized to simultaneously operate all of the ECC circuits included in the host 2001 and the data storage circuit 2003. The host 2001 and the memory controller 2002 may be realized in a signal chip according to the embodiment. The memory controller 2002 and the data storage circuit 2003 may be realized in a signal chip according to the embodiment.

According to the present disclosure, a position of a data bit which is erroneously corrected by an error correction code may be controlled.

In addition, according to the present disclosure, a position of a data bit which is erroneously corrected by an error correction code may be controlled to utilize only the data bits which are not erroneously corrected.

What is claimed is:
1. A semiconductor device comprising:
a parity generation circuit configured to generate a parity signal from an input data signal using a hamming code;
a data storage circuit configured to store the input data signal and the parity signal during a write operation and configured to generate an output data signal and an output parity signal during a read operation; and
a syndrome generation circuit configured to generate a syndrome signal for correcting errors of the output data signal from the output data signal and the output parity signal using the hamming code,
wherein the hamming code is applied in the form of an error check matrix,
wherein the error check matrix includes a first sub-matrix and a second sub-matrix,
wherein the first sub-matrix includes column vectors having an odd weight,
wherein the second sub-matrix includes an up matrix and a down matrix,
wherein each of the up matrix and the down matrix includes column vectors having an odd weight, and
wherein the syndrome generation circuit further comprises:
a plurality of internal syndrome generation circuits;
each of the plurality of internal syndrome generation circuits comprising a combination of logic gates to receive multiple output data signals and one output parity signal to output the syndrome signal,
wherein the syndrome signal is configured to prevent an erroneous correction of a data bit of the output data signal when at least two data bit errors are included in the output data signal.

2. The semiconductor device of claim 1, wherein a number of bits included in each of the column vectors of the first sub-matrix is equal to a number of bits included in the parity signal.

3. The semiconductor device of claim 1, wherein a sum of a number of bits included in each of the column vectors of the up matrix and a number of bits included in each of the column vectors of the down matrix is equal to a number of bits included in the parity signal.

4. The semiconductor device of claim 1, wherein each of the column vectors of the first sub-matrix includes an odd number of three or more bits, where the bits have a value of '1'.

5. The semiconductor device of claim 1,
wherein each of the column vectors of the up matrix includes an odd number of one or more bits having a value of '1'; and
wherein each of the column vectors of the down matrix includes an odd number of one or more bits having a value of '1'.

6. A semiconductor device comprising:
a parity generation circuit configured to generate a parity signal from an input data signal using a hamming code;
a data storage circuit configured to store the input data signal and the parity signal during a write operation and configured to generate an output data signal and an output parity signal during a read operation; and
a syndrome generation circuit configured to generate a syndrome signal for correcting errors of the output data signal from the output data signal and the output parity signal using the hamming code,
wherein the hamming code is applied in the form of an error check matrix,
wherein the error check matrix includes a first sub-matrix and a second sub-matrix,
wherein the first sub-matrix includes column vectors having an odd weight,
wherein the second sub-matrix includes a first up matrix, a first down matrix, a second up matrix and a second down matrix,
wherein the first down matrix includes column vectors having an even weight,
wherein each of the first up matrix, the second up matrix and the second down matrix includes column vectors having an odd weight, and
wherein the syndrome generation circuit further comprises:
a plurality of internal syndrome generation circuits;
each of the plurality of internal syndrome generation circuits comprising a combination of logic gates to receive multiple output data signals and one output parity signal to output the syndrome signal,
wherein the syndrome signal is configured to prevent an erroneous correction of a data bit of the output data signal when at least two data bit errors are included in the output data signal.

7. The semiconductor device of claim 6, wherein a sum of a number of bits included in each of the column vectors of the first up matrix and a number of bits included in each of the column vectors of the first down matrix equals a number of bits included in the parity signal.

8. The semiconductor device of claim 6,
wherein each of the column vectors of the first up matrix includes one or more odd number of bits having a value of '1'; and
wherein each of the column vectors of the first down matrix includes an even number of bits having a value of '1'.

9. The semiconductor device of claim 6, wherein a sum of a number of bits included in each of the column vectors of the second up matrix and a number of bits included in each of the column vectors of the second down matrix is equal to a number of bits included in the parity signal.

10. The semiconductor device of claim 6,
wherein each of the column vectors of the second up matrix includes one or more odd number of bits having a value of '1'; and
wherein each of the column vectors of the second down matrix includes one or more odd number of bits having a value of '1'.

11. A semiconductor device comprising:
a parity generation circuit configured to generate a parity signal from an input data signal using a hamming code;
a data storage circuit configured to store the input data signal and the parity signal during a write operation and configured to generate an output data signal and an output parity signal during a read operation; and
a syndrome generation circuit configured to generate a syndrome signal for correcting errors of the output data signal from the output data signal and the output parity signal using the hamming code,
wherein the hamming code is applied in the form of an error check matrix,
wherein the error check matrix includes a first sub-matrix and a second sub-matrix,
wherein the first sub-matrix includes column vectors having an odd weight,
wherein the second sub-matrix includes a first up matrix, a first down matrix, a second up matrix and a second down matrix,
wherein the first up matrix includes column vectors having an even weight,
wherein each of the first down matrix, the second up matrix and the second down matrix includes column vectors having an odd weight, and
wherein the syndrome generation circuit further comprises:
a plurality of internal syndrome generation circuits;
each of the plurality of internal syndrome generation circuits comprising a combination of logic gates to receive multiple output data signals and one output parity signal to output the syndrome signal,
wherein the syndrome signal is configured to prevent an erroneous correction of a data bit of the output data signal when at least two data bit errors are included in the output data signal.

12. The semiconductor device of claim 11,
wherein a sum of a number of bits included in each of the column vectors of the first up matrix and a number of bits included in each of the column vectors of the first down matrix is equal to a number of bits included in the parity signal; and
wherein a sum of a number of bits included in each of the column vectors of the second up matrix and a number of bits included in each of the column vectors of the second down matrix is equal to the number of bits included in the parity signal.

13. The semiconductor device of claim 11,
wherein each of the column vectors of the first up matrix includes an even number of bits having a value of '1';

wherein each of the column vectors of the first down matrix includes one or more odd number of bits having a value of '1';

wherein each of the column vectors of the second up matrix includes one or more odd number of bits having a value of '1'; and wherein each of the column vectors of the second down matrix includes one or more odd number of bits having a value of '1'.

14. A semiconductor device comprising:

a parity generation circuit configured to generate a parity signal from an input data signal using a hamming code;

a data storage circuit configured to store the input data signal and the parity signal during a write operation and configured to generate an output data signal and an output parity signal during a read operation; and a syndrome generation circuit configured to generate a syndrome signal for correcting errors of the output data signal from the output data signal and the output parity signal using the hamming code, wherein the hamming code is applied in the form of an error check matrix, wherein the error check matrix includes a first sub-matrix and a second sub-matrix, wherein the first sub-matrix includes a first up matrix, a first down matrix, a second up matrix and a second down matrix, wherein the second sub-matrix includes a third up matrix, a third down matrix, a fourth up matrix and a fourth down matrix, wherein each of the first up matrix and the fourth down matrix includes column vectors having an even weight, wherein each of the first down matrix, the second up matrix, the second down matrix, the third up matrix, the third down matrix and the fourth up matrix includes column vectors having an odd weight, and wherein the syndrome generation circuit further comprises:
   a plurality of internal syndrome generation circuits;
   each of the plurality of internal syndrome generation circuits comprising a combination of logic gates to receive multiple output data signals and one output parity signal to output the syndrome signal, wherein the syndrome signal is configured to prevent an erroneous correction of a data bit of the output data signal when at least two data bit errors are included in the output data signal.

15. The semiconductor device of claim 14, wherein a sum of a number of bits included in each of the column vectors of the first up matrix and a number of bits included in each of the column vectors of the first down matrix is equal to a number of bits included in the parity signal;

wherein a sum of a number of bits included in each of the column vectors of the second up matrix and a number of bits included in each of the column vectors of the second down matrix is equal to the number of bits included in the parity signal;

wherein a sum of a number of bits included in each of the column vectors of the third up matrix and a number of bits included in each of the column vectors of the third down matrix is equal to the number of bits included in the parity signal; and wherein a sum of a number of bits included in each of the column vectors of the fourth up matrix and a number of bits included in each of the column vectors of the fourth down matrix is equal to the number of bits included in the parity signal.

16. The semiconductor device of claim 14, wherein each of the column vectors of the first up matrix includes an even number of bits having a value of '1';

wherein each of the column vectors of the fourth down matrix includes an even number of bits having a value of '1';

wherein each of the column vectors of the first down matrix includes an odd number of one or more bits having a value of '1';

wherein each of the column vectors of the second up matrix includes an odd number of one or more bits having a value of '1';

wherein each of the column vectors of the second down matrix includes an odd number of one or more bits having a value of '1';

wherein each of the column vectors of the third up matrix includes an odd number of one or more bits having a value of '1';

wherein each of the column vectors of the third down matrix includes an odd number of one or more bits having a value of '1'; and wherein each of the column vectors of the fourth up matrix includes an odd number of one or more bits having a value of '1'.

17. A method of correcting data errors, the method comprising:

generating a parity signal through a parity generation circuit from an input data signal using a hamming code;

storing the input data signal and the parity signal through a data storage circuit during a write operation;

generating an output data signal and an output parity signal through the data storage circuit from the stored input data signal and the stored parity signal during a read operation; and generating a syndrome signal through a syndrome generation circuit for correcting errors of the output data signal from the output data signal and the output parity signal using the hamming code, wherein the hamming code is applied in the form of an error check matrix, wherein the error check matrix includes a first sub-matrix and a second sub-matrix, wherein the first sub-matrix includes column vectors having an odd weight, wherein the second sub-matrix includes an up matrix and a down matrix, wherein each of the up matrix and the down matrix includes column vectors having an odd weight, and wherein the syndrome generation circuit further comprises:
   a plurality of internal syndrome generation circuits;
   each of the plurality of internal syndrome generation circuits comprising a combination of logic gates to receive multiple output data signals and one output parity signal to output the syndrome signal, wherein the syndrome signal is configured to prevent an erroneous correction of a data bit of the output data signal when at least two data bit errors are included in the output data signal.

18. The method of claim 17, wherein a number of bits included in each of the column vectors of the first sub-matrix is equal to a number of bits included in the parity signal; and wherein a sum of a number of bits included in each of the column vectors of the up matrix and a number of bits included in each of the column vectors of the down matrix is equal to the number of bits included in the parity signal.

19. The method of claim 17, wherein each of the column vectors of the first sub-matrix includes an odd number of three or more bits, where the bits have a value of '1'.

20. The method of claim 17,
wherein each of the column vectors of the up matrix includes an odd number of one or more bits having a value of '1'; and
wherein each of the column vectors of the down matrix includes an number of one or more bits having a value of '1'.

* * * * *